United States Patent
Mc Mahan et al.

[19]

[11] Patent Number: 5,870,446
[45] Date of Patent: Feb. 9, 1999

[54] MECHANISM FOR AUTOMATICALLY ADJUSTING THE PHASE OF A TRANSMISSION STROBE CLOCK SIGNAL TO CORRECT FOR MISALIGNMENT OF TRANSMISSION CLOCK AND DATA SIGNALS

[75] Inventors: Dennis B. Mc Mahan; Mark D. Nevle; John M. Thorington, III; Dwight Edwin Wright, all of Huntsville, Ala.

[73] Assignee: Adtran, Inc., Huntsville, Ala.

[21] Appl. No.: 653,681

[22] Filed: Mar. 11, 1996

[51] Int. Cl.⁶ .......................... H04L 25/36; H04L 25/40; H04L 7/00
[52] U.S. Cl. .......................... 375/371; 375/355; 375/360; 370/516
[58] Field of Search ..................... 375/355, 359, 375/360, 362, 371, 226, 373, 558; 370/516, 503; 348/537; 381/97; 327/237; 386/13, 85

[56] References Cited

U.S. PATENT DOCUMENTS

| | | | |
|---|---|---|---|
| 4,039,748 | 8/1977 | Caron et al. | 178/69.1 |
| 4,740,998 | 4/1988 | House | 375/100 |
| 4,756,011 | 7/1988 | Cordell | 375/118 |
| 4,821,297 | 4/1989 | Bergmann et al. | 375/120 |
| 4,847,874 | 7/1989 | Kroeger et al. | 375/110 |
| 4,929,849 | 5/1990 | Paul . | |
| 4,984,255 | 1/1991 | Davis et al. | 375/106 |
| 5,256,989 | 10/1993 | Parker et al. . | |
| 5,315,181 | 5/1994 | Schowe | 307/480 |
| 5,341,403 | 8/1994 | Morley . | |
| 5,371,545 | 12/1994 | Tults . | |
| 5,471,464 | 11/1995 | Ikeda . | |

*Primary Examiner*—Jason Chan
*Assistant Examiner*—Jean B. Corrielus
*Attorney, Agent, or Firm*—Charles E. Wands

[57] ABSTRACT

A transmission strobe clock signal control mechanism continuously monitors DTE data and transmission strobe clock signals used to strobe the DTE data onto a serial communication link, and automatically adjusts the phase of the transmission strobe clock signal in response to a misalignment between the two signals that exceeds acceptable limits. In a first embodiment, the DTE data signal is sampled by a high speed clock and clocked through a 'data sample' shift register. Selected stages of the register, associated with a timing window that contains a transmission strobe clock signal edge, are coupled to an exclusive logic operation circuit, whose output indicates whether all of the data samples in the selected stages of the shift register are the same or not. If not, it is inferred that a data transition too close to the transmission strobe clock signal edge has occurred, necessitating an adjustment of the phase of the transmission strobe clock signal. In a second embodiment, a counter is clocked by high speed clock pulses between transitions in the transmission strobe clock signal and the data signal. A phase control circuit adjusts the phase of the transmission strobe clock signal in response to the number of high speed clock pulses counted not being between prescribed limits.

4 Claims, 3 Drawing Sheets

MECHANISM FOR AUTOMATICALLY ADJUSTING THE PHASE OF A TRANSMISSION STROBE CLOCK SIGNAL TO CORRECT FOR MISALIGNMENT OF TRANSMISSION CLOCK AND DATA SIGNALS

FIELD OF THE INVENTION

The present invention relates in general to digital data communication systems, and is particularly directed to a mechanism for automatically adjusting the phase of a digital data transmission strobe clock signal to ensure proper alignment of a transmission strobe clock signal edge/transition with a digital terminal equipment data signal.

BACKGROUND OF THE INVENTION

The transmission of digital communication signals, such as digitized voice or data, over a time division multiplexed (TDM) serial communications system, such as a T1telecommunications network used to transport digitized telephone signals at a bit rate of 1.544 Mb/s, customarily involves the assembly of successive telephone channels into frames of multiple channels of digital data. For example, a typical DS1 data frame contains twenty-four (64 Kb/s DSO) TDM telephone signalling channels, having eight bits per channel (plus a framing bit, for a total of 193 bits per frame). The frames are assembled into superframes (of twelve frames each), and transmitted over the serial TDM link.

Most telecommunication carriers also offer fractional T1 circuits, in increments of 56 Kb/s and 64 Kb/s, which allow a user to employ less than a full T1 circuit between two points in the network. Connection is made to the same network elements, with multiple users sharing the same interoffice T1 bandwidth. In order to interface a T1 network site with customer data terminal equipment (DTE), such as a router, computer, local area network bridges, computer aided design systems, teleconferencing equipment and the like, a service provider may install a piece of data communication equipment (DCE), for example, a T1-rate CSU/DSU (customer service unit/data service unit), such as a TSU, manufactured by Adtran Corp., Huntsville, Ala., having a single Nx56 Kbps/64 Kbps data port. The bandwidth of the data port is determined by the number of DSO channels that have been purchased from the T1 service provider, the DTE may occupy contiguous or alternate channels in the T1 serial time slot stream, and the respective channels may start at any position.

In order to strobe or clock data sourced from the DTE to the DCE, with the data then being asserted by the DCE onto the T1 link, the user typically may choose among a variety of clock sources, including the DTE clock, and normal and inverted versions of a transmission strobe clock signal selectively available at the DCE, either externally or internally during sampling of the data. The availability of these complementary versions of the DCE transmission strobe clock signal allows the user to manually select the best clock phase that will compensate for propagation delays, such as those resulting from long DTE signalling cables, and internal driver and receiver circuits of the DTE.

Unfortunately, even though the user has the ability to select different transmission strobe clock signals, an inherent problem with such a user selection technique is the fact that the parameters of each piece of data communications equipment are vendor specific, which confuses the customer, who must conduct a trial and error process, that inevitably results in the customer calling the equipment supplier to resolve the problem. This initial confusion problem is compounded by the fact that the DTE side of the DCE may also undergo a configuration change that causes a change in propagation delay, and may necessitate a change in the choice of transmission strobe clock signal.

SUMMARY OF THE INVENTION

In accordance with the present invention, these problems are effectively obviated by a digital data communication clock signal control mechanism, in particular a transmission strobe clock signal control mechanism, which continuously monitors the DTE data and the transmission strobe clock signal being employed to strobe the DTE data onto the link, and adjusts the phase of the transmission strobe clock signal, automatically, in response to a misalignment between the two signals that exceeds acceptable limits.

Pursuant to a first embodiment of the present invention, the DTE data signal is sequentially sampled by means of a high speed clock having a frequency greater than that of the transmission strobe clock signal, and the sequential DTE data samples are clocked through a first 'data sample' shift register. Selected stages of the data sample shift register are coupled to a data sample-comparator, which may be implemented as an exclusive logic operation circuit (such as an exclusive-OR circuit or an exclusive-NOR circuit), whose output remains at first logic state as long as each of the data samples has the same logic level, namely, as long as there is no logic level transition in the data signal. However, the output of the exclusive logic operation circuit changes to a second logic state if all of the clocked samples in the selected stages of the shift register are not the same —indicating that a data transition has occurred within the sequence of data samples being clocked through the data sample shift register.

When a prescribed transition (e.g., a low-to-high edge) occurs in the transmission strobe clock signal, the transmission strobe clock signal edge is clocked by the high speed clock through a second data transition 'timing window' shift register, so as to effectively delay the transmission strobe clock signal edge by a prescribed period of time associated with a data transition timing window. If, within this timing window, the DTE data signal has changed state, then, as described above, the output of the exclusive logic operation circuit will be at the second logic state, indicating that the time of occurrence of a DTE data transition is proximate (or too close to) that of a transition in the transmission strobe clock signal for valid data assertion. (Ideally, the transmission strobe clock signal edge used to strobe the DTE data into the DCE should occur midway of a data bit time, and not adjacent to either end of the bit time.)

The duration of the data transition timing window is defined by the number of stages of the timing window shift register, through which the transmission strobe clock signal edge is clocked before being read out and applied to the clock input of a 'misalignment flag' flip-flop. The data input of the misalignment flag flip-flop is coupled to the output of the data sample-comparing, exclusive logic operation circuit. As a consequence, if a DTE data transition has occurred within the data transition timing window established by the timing window shift register, then, when the misalignment flip-flop is clocked by the delayed transmission strobe clock signal edge, the state of the data sample-comparing, exclusive logic operation circuit will be at the second logic state, which is clocked into the misalignment flag flip-flop. The second logic state of the misalignment flip-flop indicates that the time of occurrence of the data transition is too close to that of the transmission strobe clock signal edge to ensure valid data assertion of the data signal.

The output of the misalignment flag flip-flop may be coupled either directly to a discrete phase generator circuit or as an input to a microcontroller which controls the phase generator. The phase generator circuit may comprise a gate circuit which selects either the normal transmission strobe clock signal or the inverted transmission strobe clock signal that are available from the DCE clock generator. Alternatively, the DTE clock may be selected. Further, rather than select from between normal and inverted DCE transmission strobe clock signals that are 180° out of phase with respect to one another, the misalignment flag flip-flop may be coupled to a vernier adjustment phase generator circuit, to vary the phase of the transmission strobed clock signal either continuously or in phase increments considerably less than 180°.

In accordance with a second embodiment of the invention, the transmission strobe clock signal is coupled to a first (enabling/disabling) control input of a digital counter, a second (disabling/enabling) control input of which is coupled to receive the DTE data signal. The net effect of the two signals is to enable the counter for a period of time between a prescribed transition (e.g., the rising edge) in the transmission strobe clock signal and an immediately preceding or succeeding transition in the DTE data signal. The separation interval between these transitions determines whether or not an adjustment of the phase of the transmission strobe clock signal is necessary. If the time of occurrence of a DTE data transition is too close to that of a transition in the transmission strobe clock signal, so that valid data assertion of the data signal cannot be assured, it is necessary to make an adjustment of the phase of the transmission strobe clock signal.

For this purpose, the digital counter is clocked by way of a high speed clock. The output of the counter may be read by a micro-controller or coupled directly to a phase control circuit. For a DCE providing complementary versions of the same transmission strobe clock signal, the output of the counter may be used to control the operation of a gate or switch within phase control circuit to select which of the complementary transmission strobe clock signals supplied by the DCE clock generator will be used to strobe or clock data sourced from the DTE to the DCE, with the data then being asserted by the DCE onto the T1 link using the selected transmission strobe clock signal.

In operation, at the end of each count measurement interval, if the accumulated count is within prescribed limits, then it is inferred that the time of occurrence of a DTE data transition is sufficiently spaced from a transition in the normal transmission strobe clock signal, so that valid data assertion of the data signal is assured for the normal transmission strobe clock signal. On the other hand, if the high speed clock counter's accumulated count is not within the prescribed limits, then it is inferred that the time of occurrence of a DTE data transition is too close to the strobe transition in the normal transmission strobe clock signal, precluding valid data assertion of the data signal, and making it necessary to adjust (e.g., invert) the phase of the transmission strobe clock signal.

DETAILED DESCRIPTION

Figure 1:
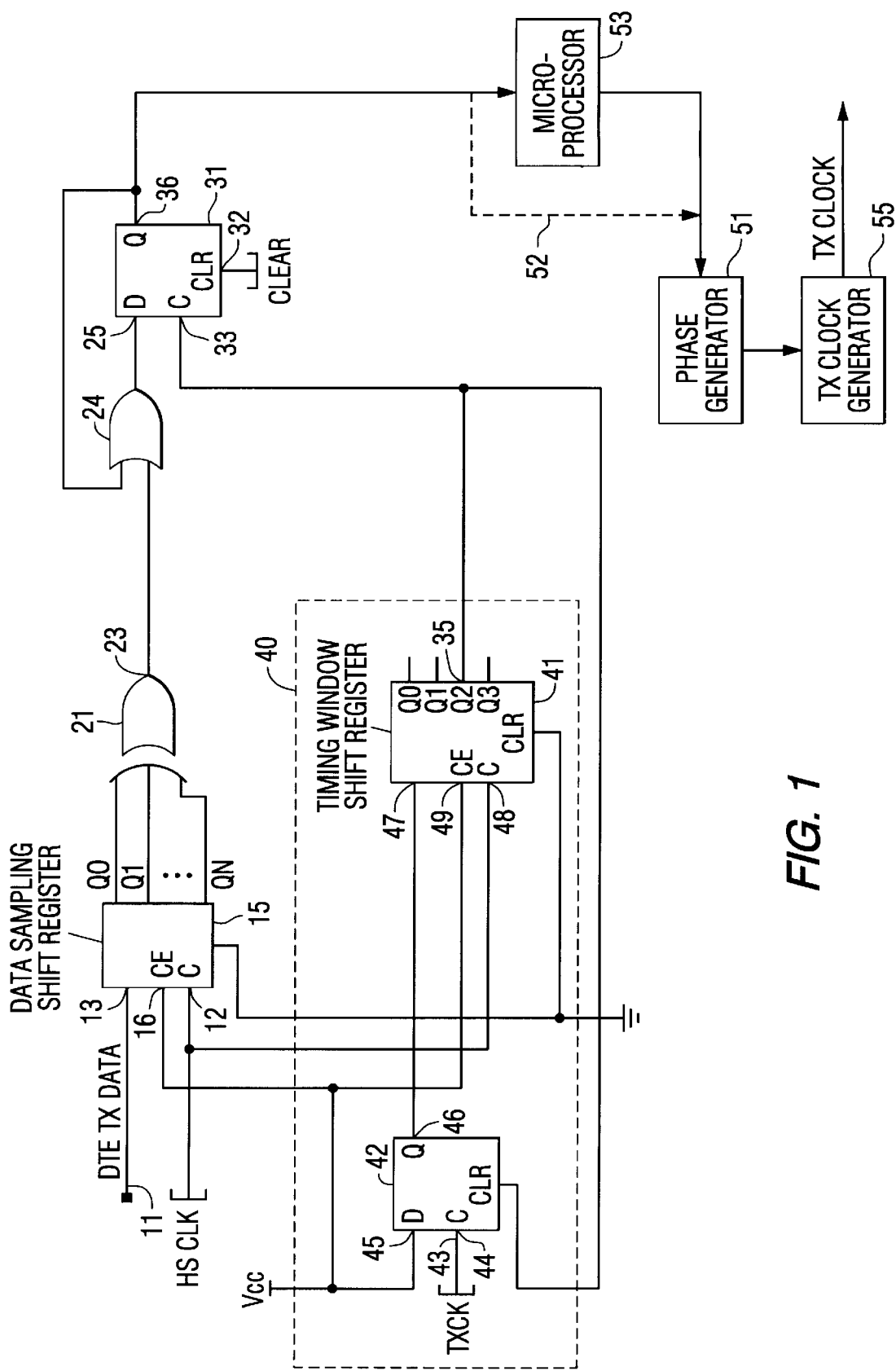
FIG. 1 diagrammatically illustrates a first, data sampling embodiment of the present invention.

Before describing in detail the automatic transmission strobe clock signal phase adjustment mechanism in accordance with the present invention, it should be observed that the invention resides primarily in what is effectively a prescribed arrangement of conventional digital communication and signal processing components resident in transceiver equipment of a respective DCE of a digital communication network. Consequently, the invention has been illustrated in the drawings in readily understandable block diagram format and associated digital signal processing schematics, which show only those specific details that are pertinent to the present invention, so as not to obscure the disclosure with details which will be readily apparent to those skilled in the art having the benefit of the description herein. Thus, the block diagram and schematic illustrations are primarily intended to illustrate the major components of the system in a convenient functional grouping, whereby the present invention may be more readily understood.

DATA SAMPLING EMBODIMENT (FIG. 1)

As pointed out briefly above, the strobe/transmission clock phase adjustment mechanism of the present invention is configured to continuously monitor each of data and transmission strobe clock signals and automatically adjust the phase of the transmission strobe clock signal in response to a misalignment between the two signals that exceeds acceptable limits. For this purpose, in accordance with a first embodiment of the present invention, diagrammatically illustrated in FIG. 1, a DTE data signal line 11 is coupled to a serial input port 13 of a first, data-sampling shift register 15. A high speed clock pulse signal HS CLK (such as a 16 MHz clock signal in the case of T1 clock (1.544 MHz)) is coupled to a clock input 12 of the shift register 15, so that sequential samples of the DTE data signal will be clocked through the data sampling shift register 15 in accordance with the high speed clock.

Selected stages of the shift register 15 are coupled to a data sample comparator 21, which may be configured as an exclusive logic operation circuit (exclusive-OR or exclusive NOR circuit). In the illustrated embodiment, data comparator 21 is shown as an exclusive OR circuit, as a non-limiting example. Exclusive-OR circuit 21 has its output 23 coupled through an OR gate 24 to a data (D) input of a phase adjustment, flag generator flip-flop 31. Flag generator flip-flop 31 has its clock (CK) input 33 coupled to the Q output 35 of a command enable unit 40 comprised of a flip-flop 42 and a second, 'timing window' shift register 41. The Q output 36 (BADCLK) of flip-flop 31 is coupled to a downstream transmission strobe clock signal phase adjustment unit, to be described and also through OR gate 24 to the D input of flip-flop 31. Flip-flop 31 is cleared by a reset signal line 32, such as that provided from the transmitter's microcontroller.

As will be described, the output of the data sample comparator 21 will remain at a first logical state (e.g., a logical 'zero'), as long as all of the clocked samples of the DTE data being clocked through the shift register 15 have the same logical value. However, should there be a transition in the data signal (from high-to-low, or low-to-high), then not all of the clocked samples being clocked through shift register 15 will have the same value, and the output of data sample comparator 21 will change to a second logic state (e.g., logical 'one'). If a data transition occurs within a prescribed data sampling 'timing window' referenced to a transition in the transmission strobe clock signal, to be described, then it is inferred that the time of occurrence of the data transition is too close to that of the transmission strobe clock signal edge to ensure valid data assertion of the data signal, necessitating an adjustment of the phase of the transmission strobe clock signal.

A transmission strobe clock signal line TXCK 43 is coupled to the clock input 44 of flip-flop 42, the data input 45 of which is hard-wired to a high logic level (Vcc), which is also coupled to the enable inputs 16 and 49 of shift registers 15 and 41, respectively. Flip-flop 42 has its Q output 46 coupled to a serial input 47 of the timing window shift register 41. Like the data sampling shift register 15, timing window shift register 41 is clocked by means of the high speed clock signal HS CLK, which is applied to its clock input 48. The output 35 of timing window shift register 41 is derived from a selected shift register stage which is effective to delay the transmission strobe clock signal TXCK by a time delay equivalent to that encompassed by the number of stages of shift register 15 supplied to data sample-comparator 21.

As will be described below with reference to a set of timing diagrams in FIG. 2, this delaying of the edge of the transmission strobe clock signal TX CLK by shift register 41 effectively bounds the transmission strobe clock signal edge within a timing window that begins prior to and terminates subsequent to a data assertion transition in the transmission strobe clock signal. The width of this timing window is selected to allow adequate set up and hold times for the data signal with respect to the transmission strobe clock signal.

Figure 2:
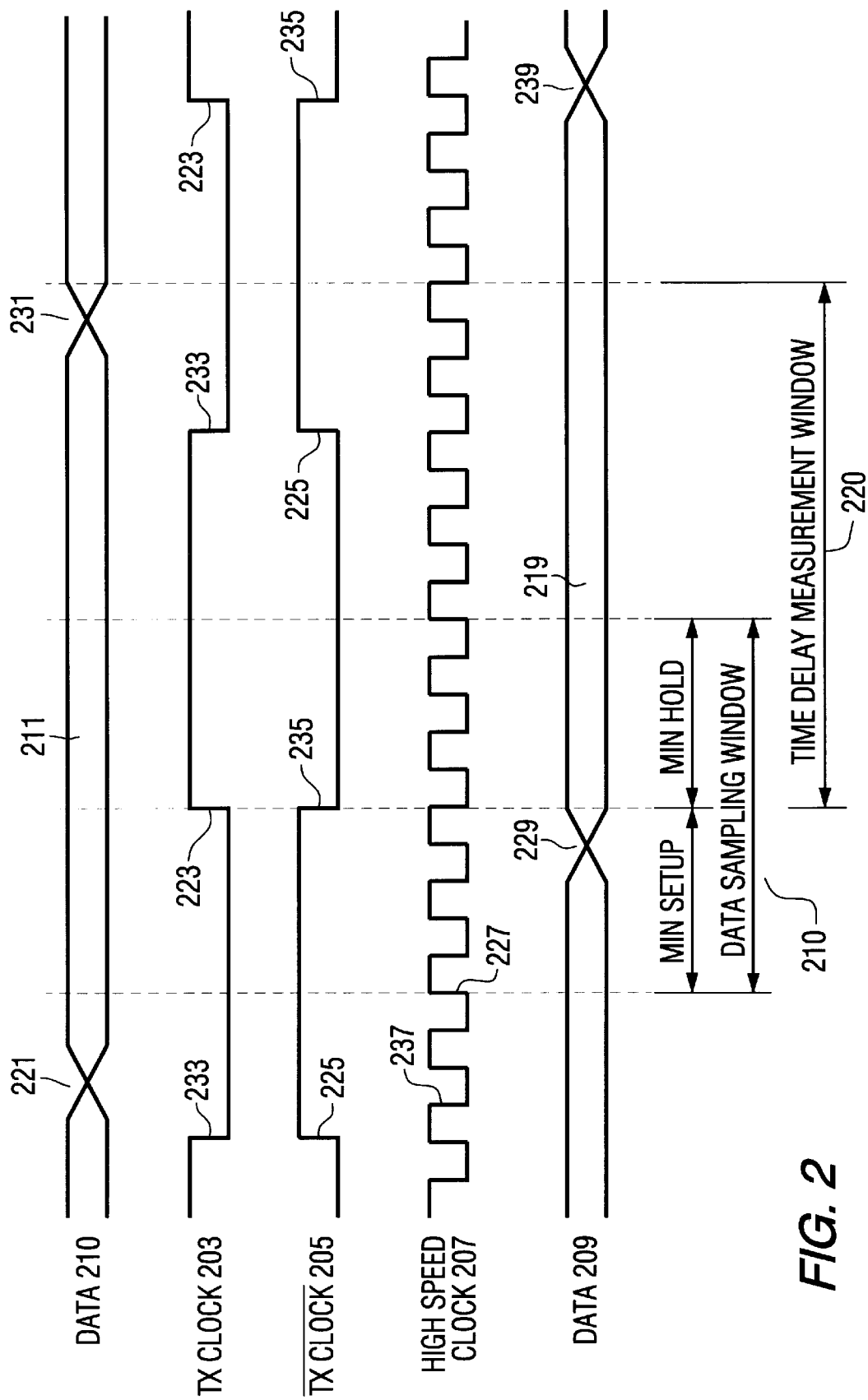
FIG. 2 is a set of timing diagrams associated with the operation of each of the embodiments of the invention.

In the non-limiting example of FIG. 2, the timing window encompasses a period of time that begins ahead of the transmission strobe clock signal by 90° and terminates 90° after the transmission strobe clock signal edge, namely, a 180° window. For a high speed clock running at ten times the transmission strobe clock signal rate, the timing window encompasses five high speed clock pulses or six low-to-high transitions in the high speed clock. It should be observed, however, that the timing window parameters are not limited to these or any other particular values. The timing window may be less than 180°, for example 90°, beginning ahead of the transmission strobe clock signal by 45° and terminating 45° after the transmission strobe clock signal edge. (For a 90° window, and a high speed clock running at ten times the transmission strobe clock signal rate, the timing window would encompass two and one-half high speed clock pulses or three low-to-high transitions in the high speed clock.)

Flag flip-flop 31 may have its Q output 36 coupled either directly to a discrete phase generator circuit 51, as shown by the broken line connection 52, or as an input to a microcontroller 53 which, in turn, controls phase generator 51. In a relatively simple circuit configuration, the phase generator circuit 51 may comprise a gate circuit which is operative in accordance with the logic state of flag flip-flop output 31 to select either the normal transmission strobe clock signal TX CK or the inverted transmission strobe clock signal TX CK BAR that are available from the DCE clock generator 55, as described above.

Alternatively, the Q output 36 of flag flip-flop 31 may be used to select the DTE clock. Further, rather than provide the ability to select from between normal and inverted DCE transmission strobe clock signals that are 180° out of phase with respect to one another, the Q output of flag flip-flop 31 may be coupled to a vernier adjustment phase generator circuit, which may vary the phase of the transmission strobe clock signal either continuously or in phase increments considerably less than 180°.

The operation of the first, data-sampling embodiment of the invention shown in FIG. 1 may be understood with reference to the timing diagram of FIG. 2, which shows a set of non-limiting relationships among a first DTE data signal 201, a normal transmission strobe clock signal 203, an inverted transmission strobe clock signal 205, a high speed clock signal 207, and a second DTE data signal 209. As pointed out above, the high speed clock signal HS CLK 207 has a frequency greater than that of the transmission strobe clock signal TX CK and is sufficiently fast to provide adequate sampling of the DTE data signals 201 and 209, and the complementary transmission strobe clock signals 203 and 205. As a non-limiting example, a high speed clock rate that is an order of magnitude greater than that of the transmission strobe clock signal is sufficient for this purpose. Thus for a T1 transmission strobe clock signal, which has a frequency of 1.544 MHz, a high speed clock rate of 16 MHz meets such a sampling rate requirement.

The first DTE data signal 201 is shown as being stable (high or low) within a time interval 211 between logic level transitions 221 and 231. The normal transmission strobe clock signal TX CLOCK 203 is shown as having low-to-high clock edges 223 and high-to-low clock edges 233, sequentially spaced apart from one another by 180°. Conversely, the inverted transmission strobe clock signal 205 is shown as having low-to-high clock edges 225 and high-to-low clock edges 235, sequentially spaced apart from one another by 180°. The high speed clock signal 207 is shown as having low-to-high clock edges 227 and high-to-low edges 237. The second DTE data signal 209 is shown as being stable (high or low) within an interval 219 between logic level transitions 229 and 239. For purposes of the present description, it will be assumed that the DTE data signal is clocked by a low-to-high edge or transition in the transmission strobe clock signal of interest.

Considering first the DTE data signal 201, during the interval 211 between logic level transitions 221 and 231, with the first DTE data signal 201 being at a stable high or low logic level, successive samples of the same data value will be clocked through shift register 15 by the high speed clock signal 207. During this interval 211, the normal transmission strobe clock signal 203 is shown as undergoing a prescribed transition (low-to-high edge) 223, which clocks the flip-flop 42, and causes the Q output 46 of flip-flop 42 to go from low to high. At the next low-to-high edge 227 of the high speed clock signal 207, this high logic level at the Q output 46 of flip-flop 41 is clocked into the first stage of shift register 41. As the low-to-high edge 223 in the normal transmission strobe clock signal 203 is clocked by the high speed clock through shift register 41, it is eventually clocked into the selected stage of timing window shift register 41 from which its output 35 is derived.

As described above, the output 35 of timing window shift register 41 is derived from that stage which is effective to delay the transmission strobe clock signal by a total delay time equivalent to that of a data sampling 'timing window' (shown at 210 in FIG. 2), which is encompassed by the number of stages (stored data samples) of shift register 15, whose contents are supplied to data comparator 21. Thus, the output 35 of shift register 41 provides a delayed version of the transmission strobe clock signal 203, that effectively delays transmission strobe clock edge 223 by a period of time associated with the data transition 'timing window' 210.

If, within this timing window 210, the first DTE data signal 201 has not changed state (corresponding to its steady state interval 211 in the illustrated example of FIG. 2), then all of the data sample inputs to the data sample comparator (exclusive-OR circuit) 21 will be the same, and the output of exclusive-OR circuit 21 will be a logical 'zero'. (Ideally, the time of occurrence of the delayed transmission strobe clock edge 223 will occur midway of a data bit interval 211.) This logic state condition indicates that the times of occurrence of data transitions 221 and 231 in the first DTE data signal 201 are sufficiently spaced apart from the strobe edge 223 of the normal transmission strobe clock signal 203 for valid data assertion.

On the other hand, for the second DTE data signal 209, a transition 229 occurs within the timing window 210, so that the output of the data sample-comparing, exclusive-OR circuit 21 will be a logical 'one'—indicating that the time of occurrence of data transition 229 is too close to that of transition 223 in the normal transmission strobe clock signal 203 for valid data assertion of the second DTE data signal 209, necessitating an adjustment of the phase of the transmission strobe clock signal. The logic level output of data-sample comparing, exclusive-OR circuit 21 will be latched into flag flip-flop 31 by the delayed transmission strobe clock signal at the output 35 of shift register 41, so that it may be read by micro-controller 53, or coupled directly to phase control circuit 51, as described above. In the case of a DCE providing complementary versions of the same transmission strobe clock signal —transmission strobe clock signals 203 and 205 in FIG. 2, the output of flag flip-flop 31 may readily control the operation of a gate or switch within phase control circuit 51 to select the transmission strobe clock signal.

TIME DELAY EMBODIMENT (FIG. 3)

Figure 3:
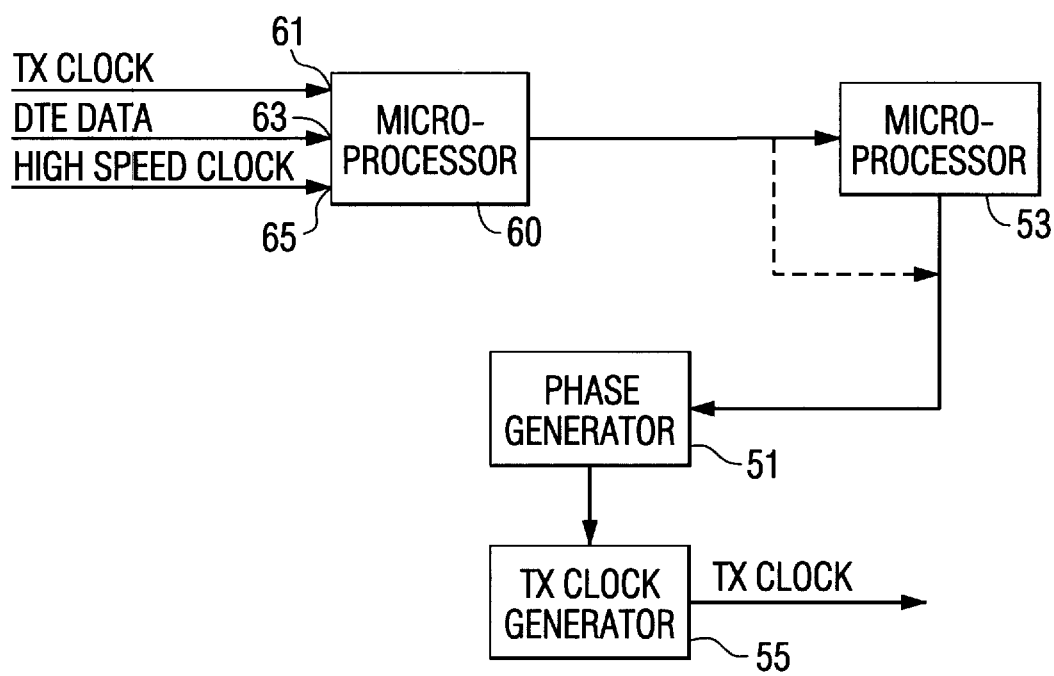
FIG. 3 diagrammatically illustrates a second, time delay embodiment of the present invention.

In accordance with a second embodiment of the invention, diagrammatically illustrated in FIG. 3, the transmission strobe clock signal TX CLOCK is coupled to a first (enabling) control input 61 of a digital counter 60, a second (disabling) control input 63 of which is coupled to receive the DTE data signal. Alternatively, the transmission strobe clock signal TX CLOCK may be coupled to the enabling control input 61, and the disabling control input 63 may be coupled to receive the DTE data signal. The net effect of the two signals is to enable the counter for a period of time between a prescribed transition (e.g., the rising edge) in the transmission strobe clock signal TX CLOCK and an immediately preceding or succeeding transition in the DTE data signal.

As discussed above in connection with the description of the first embodiment, the time separation between these transitions determines whether or not adjustment of the phase of the transmission strobe clock signal is necessary. If the time of occurrence of a DTE data transition is too close to that of a transition in the transmission strobe clock signal, so that valid data assertion of the data signal cannot be assured, it is necessary to make an adjustment of the phase of the transmission strobe clock signal.

For this purpose, the counter 60 is clocked by way of a high speed clock HS CLK (such as the above-mentioned 16 MHz clock signal in the case of T1transmission strobe clock signal (1.544 MHz)) applied to clock input 65. As in the first embodiment of FIG. 1, the output 67 of the counter 60 may be read by micro-controller 53, or coupled directly to phase control circuit 51. Again, for a DCE providing complementary versions of the same transmission strobe clock signal —the transmission strobe clock signals 203 and 205 in FIG. 2, the output of the counter may be used to control the operation of a gate or switch within phase control circuit 51, to select the transmission strobe clock signal.

In operation, at the end of each count measurement interval or window, shown at 220 in FIG. 2, if the accumulated count of counter 60 is within prescribed limits, it is inferred that the time of occurrence of a DTE data transition (e.g., transition 221) is sufficiently spaced from a transition (223) in the normal transmission strobe clock signal 203, so that valid data assertion of the data signal is assured for the normal transmission strobe clock signal.

However, if the high speed clock counter's accumulated count exceeds the prescribed limit, as is the case for the second DTE data signal 209, then it is inferred that the time of occurrence of a DTE data transition 229 is too close to transition 223 in the normal transmission strobe clock signal 203, whereby valid data assertion of the data signal cannot be assured, making it necessary to adjust (e.g., invert) the phase of the transmission strobe clock signal (for example, switching the transmission strobe clock signal to the inverted transmission strobe clock signal 205.

As will be appreciated from the foregoing description, the transmission strobe clock signal control mechanism of the present invention effectively remedies the inability of conventional digital data transmission equipment (even that type of equipment which provides complementary versions of a DTE data transmission strobe clock signal) to accommodate a variation in propagation delay. By continuously monitoring the DTE data and the transmission strobe clock signal used to strobe the DTE data onto the link, the present invention is able to automatically adjust the phase of the transmission strobe clock signal in response to a misalignment between the two signals that exceeds acceptable limits.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A method of controlling the sampling of a data signal that transitions between first and second logic states comprising the steps of:

(a) supplying a fixed frequency sampling clock signal having prescribed polarity transitions which are used to sample said data signal;

(b) monitoring occurrences of transitions of said data signal between said first and second logic states thereof; and (c) in response to a transition of said data signal occurring within a predetermined time proximity of occurrence of any prescribed polarity transition of said sampling clock signal, said predetermined time proximity providing adequate set up and hold time for the logic state of said data signal at the time said data signal is sampled by said any prescribed polarity transition of said sampling clock signal, changing the phase of said sampling clock signal so that said prescribed polarity transitions of said sampling clock signal will thereafter sample said data signal at a stable logic state of said data signal; and wherein step (b) comprises clocking sequential samples of said data signal through a first shift register by means of a high speed clock signal, subjecting said sequential samples stored in said first shift register to an exclusive logic operation circuit, coupling the result of said exclusive logic operation circuit to a data input of a flip-flop, clocking a transition in said data signal through a second shift register by means of said high speed clock signal, and coupling a prescribed stage of said second shift register to a clock input of said flip-flop, and wherein step (c) comprises, in response to a prescribed logic level at an output of said flip-flop, adjusting the phase of said sampling clock signal.

2. A method according to claim 1, wherein step (c) comprises inverting the phase of said sampling clock signal.

3. A method of controlling the sampling of a data signal that transitions between first and second logic states comprising the steps of:

(a) supplying a fixed frequency sampling clock signal having prescribed polarity transitions which are used to sample said data signal;

(b) monitoring occurrences of transitions of said data signal between said first and second logic states thereof; and (c) in response to a transition of said data signal occurring within a predetermined time proximity of occurrence of any prescribed polarity transition of said sampling clock signal, said predetermined time proximity providing adequate set up and hold time for the logic state of said data signal at the time said data signal is sampled by said any prescribed polarity transition of said sampling clock signal, changing the phase of said sampling clock signal so that said prescribed polarity transitions of said sampling clock signal will thereafter sample said data signal at a stable logic state of said data signal, and wherein step (c) comprises sequentially changing a count total over a selected one of:

i—a first count interval that starts at a transition in said data signal and terminates at the next occurrence of said prescribed polarity transition in said sampling clock signal immediately following said transition in said data signal, and ii—a second count interval that starts with an occurrence of said prescribed polarity transition in said sampling clock signal and terminates at the next transition in said data signal immediately following said occurrence of said prescribed polarity transition in said sampling clock signal, and in response to said count total being less than a prescribed value, adjusting the phase of said sampling clock signal so as to cause transitions in said data signal, relative to occurrences of prescribed polarity transitions in said sampling clock signal, to occur outside of said predetermined time proximity, and thereby provide adequate set up and hold time for the logic state of said data signal at the time said data signal is sampled by a prescribed polarity transition of said sampling clock signal.

4. A circuit arrangement for controlling a fixed frequency sampling clock signal having prescribed polarity transitions which are used to sample a data signal that transitions between first and second logic states comprising:

a counter coupled to receive said sampling clock signal, said data signal and a high speed clock signal, and being operative to modify a count total thereof in accordance with said high speed clock signal over a selected one of first and second count intervals, said first count interval starting at a transition in said data signal and terminating at the next occurrence of said prescribed polarity transition in said sampling clock signal immediately following said transition in said data signal, and said second count interval starting with an occurrence of said prescribed polarity transition in said sampling clock signal and terminating at the next transition in said data signal immediately following said occurrence of said prescribed polarity transition in said sampling clock signal; and a control circuit coupled to said counter and being operative, in response to said count total being less than a prescribed value representative of a predetermined time proximity between occurrence of any prescribed polarity transition of said sampling clock signal and a transition of said data signal, said predetermined time proximity providing adequate set up and hold time for the logic state of said data signal at the time said data signal is sampled by said any prescribed polarity transition of said sampling clock signal, to change the phase of said sampling clock signal so that said prescribed polarity transitions of said sampling clock signal will thereafter sample said data signal at a stable logic state of said data signal.

* * * * *